US008889566B2

(12) United States Patent
Chatterjee et al.

(10) Patent No.: US 8,889,566 B2
(45) Date of Patent: Nov. 18, 2014

(54) LOW COST FLOWABLE DIELECTRIC FILMS (71) Applicant: Applied Materials, Inc., Santa Clara, CA (US)

(72) Inventors: Amit Chatterjee, Cupertino, CA (US); Abhijit Basu Mallick, Palo Alto, CA (US); Nitin K. Ingle, San Jose, CA (US); Brian Underwood, Santa Clara, CA (US); Kiran V. Thadani, Sunnyvale, CA (US); Xiaolin Chen, San Ramon, CA (US); Abhishek Dube, Belmont, CA (US); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 254 days.

(21) Appl. No.: 13/668,657

(22) Filed: Nov. 5, 2012

(65) Prior Publication Data
US 2014/0073144 A1 Mar. 13, 2014

Related U.S. Application Data (60) Provisional application No. 61/699,495, filed on Sep. 11, 2012.

(51) Int. Cl.
| C23C 16/32 | (2006.01) |
| C23C 16/34 | (2006.01) |
| C23C 16/50 | (2006.01) |
| H01L 21/02 | (2006.01) |
| H01L 21/31 | (2006.01) |
| H01L 21/318 | (2006.01) |

(52) U.S. Cl.
CPC .............................. *H01L 21/02274* (2013.01)
USPC . 438/778; 438/793; 427/249.15; 427/255.18; 427/255.17; 427/255.393; 427/255.394

(58) Field of Classification Search
CPC .................................................. H01L 21/02274
USPC ................ 438/793, 778; 427/249.15, 255.18, 427/255.17, 255.393, 255.394
See application file for complete search history.

(56) References Cited

U.S. PATENT DOCUMENTS 4,147,571 A 4/1979 Stringfellow et al.
4,200,666 A 4/1980 Reinberg
(Continued)

FOREIGN PATENT DOCUMENTS

CN 1830072 A 9/2006
DE 19654737 A1 7/1997
(Continued)

OTHER PUBLICATIONS

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

(Continued)

Primary Examiner — Mary Wilczewski
(74) Attorney, Agent, or Firm — Kilpatrick Townsend & Stockton LLP (57) ABSTRACT A method of forming a dielectric layer is described. The method deposits a silicon-containing film by chemical vapor deposition using a local plasma. The silicon-containing film is flowable during deposition at low substrate temperature. A silicon precursor (e.g. a silylamine, higher order silane or halogenated silane) is delivered to the substrate processing region and excited in a local plasma. A second plasma vapor or gas is combined with the silicon precursor in the substrate processing region and may include ammonia, nitrogen ($N_2$), argon, hydrogen ($H_2$) and/or oxygen ($O_2$). The equipment configurations disclosed herein in combination with these vapor/gas combinations have been found to result in flowable deposition at substrate temperatures below or about 200° C. when a local plasma is excited using relatively low power.

20 Claims, 4 Drawing Sheets

(56) References Cited

U.S. PATENT DOCUMENTS

| | | |
|---|---|---|
| 4,816,098 A | 3/1989 | Davis et al. |
| 4,818,326 A | 4/1989 | Liu et al. |
| 4,848,400 A | 7/1989 | Grant et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |
| 5,081,069 A | 1/1992 | Parker et al. |
| 5,110,407 A | 5/1992 | Ono et al. |
| 5,125,360 A | 6/1992 | Nakayama et al. |
| 5,148,714 A | 9/1992 | McDiarmid |
| 5,212,119 A | 5/1993 | Hah et al. |
| 5,252,178 A | 10/1993 | Moslehi |
| 5,279,784 A | 1/1994 | Bender et al. |
| 5,304,250 A | 4/1994 | Sameshima et al. |
| 5,328,558 A | 7/1994 | Kawamura |
| 5,364,488 A | 11/1994 | Minato et al. |
| 5,393,708 A | 2/1995 | Hsia et al. |
| 5,412,180 A | 5/1995 | Coombs |
| 5,434,109 A | 7/1995 | Geissler et al. |
| 5,443,647 A | 8/1995 | Aucoin et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,569,350 A | 10/1996 | Osada et al. |
| 5,578,532 A | 11/1996 | van de Ven et al. |
| 5,587,014 A | 12/1996 | Iyechika et al. |
| 5,620,525 A | 4/1997 | van de Ven et al. |
| 5,622,784 A | 4/1997 | Okaue et al. |
| 5,630,881 A | 5/1997 | Ogure et al. |
| 5,635,409 A | 6/1997 | Moslehi |
| 5,665,643 A | 9/1997 | Shin |
| 5,683,518 A | 11/1997 | Moore et al. |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,812,403 A | 9/1998 | Fong et al. |
| 5,843,233 A | 12/1998 | van de Ven et al. |
| 5,853,607 A | 12/1998 | Zhao et al. |
| 5,882,414 A | 3/1999 | Fong et al. |
| 5,882,417 A | 3/1999 | van de Ven et al. |
| 5,902,407 A | 5/1999 | deBoer et al. |
| 5,925,411 A | 7/1999 | van de Ven et al. |
| 5,926,737 A | 7/1999 | Ameen et al. |
| 5,935,340 A | 8/1999 | Xia et al. |
| 5,961,850 A | 10/1999 | Satou et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,021,785 A | 2/2000 | Grutzediek et al. |
| 6,024,044 A | 2/2000 | Law et al. |
| 6,074,696 A | 6/2000 | Sato |
| 6,077,412 A | 6/2000 | Ting et al. |
| 6,087,243 A | 7/2000 | Wang |
| 6,090,442 A | 7/2000 | Klaus et al. |
| 6,110,838 A | 8/2000 | Loewenstein |
| 6,114,219 A | 9/2000 | Spikes, Jr. et al. |
| 6,121,130 A | 9/2000 | Chua et al. |
| 6,146,970 A | 11/2000 | Witek et al. |
| 6,148,761 A | 11/2000 | Majewski et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,203,657 B1 | 3/2001 | Collison et al. |
| 6,207,587 B1 | 3/2001 | Li et al. |
| 6,211,040 B1 | 4/2001 | Liu et al. |
| 6,258,690 B1 | 7/2001 | Zenke |
| 6,287,962 B1 | 9/2001 | Lin |
| 6,296,255 B1 | 10/2001 | Hashimoto |
| 6,339,997 B1 | 1/2002 | Nakagawa et al. |
| 6,355,581 B1 | 3/2002 | Vassiliev et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,450,117 B1 | 9/2002 | Murugesh et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,524,931 B1 | 2/2003 | Perera |
| 6,528,332 B2 | 3/2003 | Mahanpour et al. |
| 6,548,416 B2 | 4/2003 | Han et al. |
| 6,566,278 B1 | 5/2003 | Harvey et al. |
| 6,583,063 B1 | 6/2003 | Khan et al. |
| 6,583,069 B1 | 6/2003 | Vassiliev et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,660,662 B2 | 12/2003 | Ishikawa et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,758,224 B2 | 7/2004 | Nogami |
| 6,762,126 B2 | 7/2004 | Cho et al. |
| 6,787,191 B2 | 9/2004 | Hanahata et al. |
| 6,800,571 B2 | 10/2004 | Cheung et al. |
| 6,812,157 B1 | 11/2004 | Gadgil |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,849,520 B2 | 2/2005 | Kim et al. |
| 6,858,523 B2 | 2/2005 | DeBoer et al. |
| 6,858,533 B2 | 2/2005 | Chu et al. |
| 6,872,323 B1 | 3/2005 | Entley et al. |
| 6,875,687 B1 | 4/2005 | Weidman et al. |
| 6,884,685 B2 | 4/2005 | Luo et al. |
| 6,890,403 B2 | 5/2005 | Cheung et al. |
| 6,900,067 B2 | 5/2005 | Kobayashi et al. |
| 6,935,466 B2 | 8/2005 | Lubomirsky et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,479,210 B2 | 1/2009 | Mullapudi et al. |
| 7,498,273 B2 | 3/2009 | Mallick et al. |
| 7,514,375 B1 | 4/2009 | Shanker et al. |

(56) References Cited

U.S. PATENT DOCUMENTS

| | | |
|---|---|---|
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,622,369 B1 | 11/2009 | Lee et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,964,040 B2 | 6/2011 | Rasheed et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 * | 6/2013 | Wang et al. ............... 438/787 |
| 8,557,712 B1 * | 10/2013 | Antonelli et al. ........... 438/761 |
| 8,765,573 B2 * | 7/2014 | Mallick et al. ............. 438/422 |
| 8,771,539 B2 * | 7/2014 | Zhang et al. ............... 216/79 |
| 2001/0006070 A1 | 7/2001 | Shang et al. |
| 2001/0021595 A1 | 9/2001 | Jang |
| 2001/0024691 A1 | 9/2001 | Kimura et al. |
| 2001/0029114 A1 | 10/2001 | Vulpio et al. |
| 2001/0029892 A1 | 10/2001 | Cook et al. |
| 2001/0038919 A1 | 11/2001 | Berry et al. |
| 2001/0040099 A1 | 11/2001 | Pedersen et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0000202 A1 | 1/2002 | Yuda et al. |
| 2002/0027286 A1 | 3/2002 | Sundararajan et al. |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0119607 A1 | 8/2002 | Miyasaka et al. |
| 2002/0127350 A1 | 9/2002 | Ishikawa et al. |
| 2002/0129769 A1 | 9/2002 | Kim et al. |
| 2002/0139307 A1 | 10/2002 | Ryding et al. |
| 2002/0142585 A1 | 10/2002 | Mandal |
| 2002/0146879 A1 | 10/2002 | Fu et al. |
| 2002/0160585 A1 | 10/2002 | Park |
| 2002/0163637 A1 | 11/2002 | Rossman et al. |
| 2002/0164421 A1 | 11/2002 | Chiang et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2002/0185067 A1 | 12/2002 | Upham |
| 2002/0189760 A1 | 12/2002 | Park |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0073310 A1 | 4/2003 | Olgado et al. |
| 2003/0077918 A1 | 4/2003 | Wu et al. |
| 2003/0094773 A1 | 5/2003 | Lerner |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143328 A1 | 7/2003 | Chen et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 | 11/2003 | Dubin et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0048492 A1 | 3/2004 | Ishikawa et al. |
| 2004/0065253 A1 | 4/2004 | Tois et al. |
| 2004/0082131 A1 | 4/2004 | Tsujikawa et al. |
| 2004/0083967 A1 | 5/2004 | Yuda et al. |
| 2004/0084680 A1 | 5/2004 | Ruelke et al. |
| 2004/0094091 A1 | 5/2004 | Yang et al. |
| 2004/0110354 A1 | 6/2004 | Natzle et al. |
| 2004/0134773 A1 | 7/2004 | Pedersen et al. |
| 2004/0139983 A1 | 7/2004 | Lakshmanan et al. |
| 2004/0144490 A1 | 7/2004 | Zhao et al. |
| 2004/0152342 A1 | 8/2004 | Li et al. |
| 2004/0159343 A1 | 8/2004 | Kaoru et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0206305 A1 | 10/2004 | Choi et al. |
| 2004/0211664 A1 | 10/2004 | Wang |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0231799 A1 | 11/2004 | Lee et al. |
| 2004/0241342 A1 | 12/2004 | Karim et al. |
| 2004/0253826 A1 | 12/2004 | Ivanov et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0042889 A1 | 2/2005 | Lee et al. |
| 2005/0062165 A1 | 3/2005 | Saenger et al. |
| 2005/0087140 A1 | 4/2005 | Yuda et al. |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0153574 A1 | 7/2005 | Mandal |
| 2005/0160974 A1 | 7/2005 | Ivanov et al. |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0217578 A1 | 10/2005 | Gurary et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0075967 A1 | 4/2006 | Lu et al. |

(56) References Cited

U.S. PATENT DOCUMENTS

| | | |
|---|---|---|
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0158101 A1 | 7/2006 | Camilletti et al. |
| 2006/0159847 A1 | 7/2006 | Porter et al. |
| 2006/0160372 A1 | 7/2006 | Dorfman |
| 2006/0162661 A1 | 7/2006 | Jung et al. |
| 2006/0178018 A1 | 8/2006 | Olsen |
| 2006/0211265 A1 | 9/2006 | Trott |
| 2006/0223315 A1 | 10/2006 | Yokota et al. |
| 2006/0225648 A1 | 10/2006 | Rasheed et al. |
| 2006/0228903 A1 | 10/2006 | McSwiney et al. |
| 2006/0251499 A1 | 11/2006 | Lunday et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0080057 A1 | 4/2007 | Yasuhiro et al. |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0235062 A1 | 10/2007 | Naozumi et al. |
| 2007/0275569 A1 | 11/2007 | Moghadam et al. |
| 2007/0277734 A1 | 12/2007 | Lubomirsky et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0070409 A1 | 3/2008 | Park et al. |
| 2008/0081104 A1 | 4/2008 | Hasebe et al. |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0178805 A1 | 7/2008 | Paterson et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat et al. |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0120368 A1 | 5/2009 | Lubomirsky et al. |
| 2009/0120464 A1 | 5/2009 | Muhammad et al. |
| 2009/0120584 A1 | 5/2009 | Lubomirsky et al. |
| 2009/0142935 A1 | 6/2009 | Fukuzawa et al. |
| 2009/0170282 A1 | 7/2009 | Dong |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0206409 A1 | 8/2009 | Arisumi et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0052066 A1 | 3/2010 | Yu et al. |
| 2010/0059889 A1 | 3/2010 | Gosset et al. |
| 2010/0081094 A1 | 4/2010 | Hasebe et al. |
| 2010/0081293 A1 | 4/2010 | Mallick et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1 | 9/2010 | Mizuno |
| 2010/0230052 A1 | 9/2010 | Iizuka |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0151677 A1 | 6/2011 | Wang et al. |
| 2011/0151678 A1* | 6/2011 | Ashtiani et al. .............. 438/786 |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0073501 A1 | 3/2012 | Lubomirsky et al. |
| 2012/0074387 A1 | 3/2012 | King |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |

(56) References Cited

U.S. PATENT DOCUMENTS

| | | | |
|---|---|---|---|
| 2012/0122302 A1 | 5/2012 | Weidman et al. | |
| 2012/0142192 A1 | 6/2012 | Li et al. | |
| 2012/0145079 A1 | 6/2012 | Lubomirsky et al. | |
| 2012/0149213 A1* | 6/2012 | Nittala et al. | 438/783 |
| 2012/0161405 A1 | 6/2012 | Mohn et al. | |
| 2012/0177846 A1 | 7/2012 | Li et al. | |
| 2012/0180954 A1 | 7/2012 | Yang et al. | |
| 2012/0190178 A1 | 7/2012 | Wang et al. | |
| 2012/0193778 A1 | 8/2012 | Mawatari | |
| 2012/0211462 A1* | 8/2012 | Zhang et al. | 216/13 |
| 2012/0213940 A1 | 8/2012 | Mallick | |
| 2012/0225565 A1 | 9/2012 | Bhatia et al. | |
| 2012/0238108 A1 | 9/2012 | Chen et al. | |
| 2012/0269989 A1 | 10/2012 | Liang et al. | |
| 2012/0292720 A1 | 11/2012 | Chen et al. | |
| 2012/0309205 A1 | 12/2012 | Wang et al. | |
| 2013/0062736 A1 | 3/2013 | Brighton et al. | |
| 2013/0084711 A1 | 4/2013 | Liang et al. | |
| 2013/0149462 A1 | 6/2013 | Liang et al. | |
| 2013/0193578 A1 | 8/2013 | Yu et al. | |
| 2013/0230987 A1* | 9/2013 | Draeger et al. | 438/694 |
| 2013/0288485 A1* | 10/2013 | Liang et al. | 438/782 |
| 2014/0073144 A1* | 3/2014 | Chatterjee et al. | 438/793 |

FOREIGN PATENT DOCUMENTS

| | | | |
|---|---|---|---|
| EP | 0892083 A1 | 1/1999 | |
| EP | 1095958 B1 | 5/2001 | |
| EP | 1469509 A1 | 10/2004 | |
| EP | 1 601 011 A1 * | 11/2006 | H01L 21/336 |
| EP | 1717848 A | 11/2006 | |
| EP | 1791161 A2 | 5/2007 | |
| EP | 2022087 A2 | 5/2007 | |
| JP | 57-75738 U | 10/1980 | |
| JP | 61-234534 A | 10/1986 | |
| JP | 64-048425 A | 2/1989 | |
| JP | 1-198033 A | 8/1989 | |
| JP | 01-235259 A | 9/1989 | |
| JP | 01241826 A | 9/1989 | |
| JP | 03-197684 A | 8/1991 | |
| JP | 03-286531 | 12/1991 | |
| JP | 2004-328825 | 11/1992 | |
| JP | 05-259156 | 10/1993 | |
| JP | 05-304147 A | 11/1993 | |
| JP | 06-077150 A | 3/1994 | |
| JP | 6-168930 A | 6/1994 | |
| JP | 07-014826 A | 1/1995 | |
| JP | 07-169762 A | 7/1995 | |
| JP | 07-316823 A | 12/1995 | |
| JP | 08-236518 A | 9/1996 | |
| JP | 08-288286 A | 11/1996 | |
| JP | 09-008014 A | 1/1997 | |
| JP | 09-237785 A | 9/1997 | |
| JP | 10-163183 A | 6/1998 | |
| JP | 11-274285 A | 10/1999 | |
| JP | 2001-148382 A | 5/2001 | |
| JP | 2002-370059 A | 12/2002 | |
| JP | 2003-179054 | 6/2003 | |
| JP | 2004-012315 | 1/2004 | |
| JP | 2004-327639 | 11/2004 | |
| JP | 2004-536444 A | 12/2004 | |
| JP | 2005-142448 A | 6/2005 | |
| JP | 2005-268396 A | 9/2005 | |
| JP | 2005-302848 A | 10/2005 | |
| JP | 2006-041539 A | 2/2006 | |
| JP | 2006-210878 A | 8/2006 | |
| JP | 2007-019067 A | 1/2007 | |
| JP | 2007-191728 A | 8/2007 | |
| JP | 2007-324154 A | 12/2007 | |
| JP | 2008-159824 A | 7/2008 | |
| JP | 2008/218684 A | 9/2008 | |
| JP | 2011-220127 A | 11/2011 | |
| KR | 10-1999-0010957 A | 2/1999 | |
| KR | 0204793 B1 | 3/1999 | |
| KR | 1020000011360 A | 2/2000 | |
| KR | 1020020013383 A | 2/2002 | |
| KR | 10-2004-0091978 A | 11/2004 | |
| KR | 1020040104533 A | 12/2004 | |
| KR | 10-2005-0003758 A | 1/2005 | |
| KR | 10-2005-0072332 A | 7/2005 | |
| KR | 10-2005-0085838 | 8/2005 | |
| KR | 10-2005-0094183 A | 9/2005 | |
| KR | 1020060081350 A | 7/2006 | |
| KR | 1020060103640 A | 10/2006 | |
| KR | 10-2009-0011765 A | 2/2009 | |
| KR | 10-2009-0121361 | 11/2009 | |
| KR | 10-2009-0122860 A | 12/2009 | |
| KR | 10-2010-0085743 A | 7/2010 | |
| TW | 200514163 | 4/2005 | |
| TW | 200707582 | 2/2007 | |
| WO | 02/077320 A1 | 10/2002 | |
| WO | 03/066933 A | 8/2003 | |
| WO | 2005/078784 A | 8/2005 | |
| WO | 2006/014034 A1 | 2/2006 | |
| WO | 2007/040856 A2 | 4/2007 | |
| WO | 2007/140376 A | 12/2007 | |
| WO | 2007/140377 A | 12/2007 | |
| WO | 2007/140424 A | 12/2007 | |
| WO | 2009/055340 A1 | 4/2009 | |
| WO | 2010/080216 | 7/2010 | |
| WO | WO 2011/084812 * | 7/2011 | H01L 21/31 |
| WO | 2012/145148 A2 | 10/2012 | |
| WO | 2013-025336 | 2/2013 | |
| WO | WO 2014/042833 * | 3/2014 | H01L 21/205 |

OTHER PUBLICATIONS

Aylett, B. J. et al., "Silicon-Nitrogen Compounds. Part V. Diphenylamino-derivatives of Silane," J. Chem. Soc. (A), Apr. 1969, pp. 636-638.

Aylett, B. J. et al., "Silicon-Nitrogen Compounds. Part VI. [1] The Preparation and Properties of Disilazane," J. Chem. Soc. (A), Apr. 1969, pp. 639-642.

Aylett, B. J. et al., "The Preparation and Some Properties of Disilylamine-Correspondence," Inorganic Chemistry, Jan. 1966, p. 167.

Beach, "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.

Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Franz, et al., "Conversion of silicon nitride into silicon dioxide through the influence of oxygen," Solid-State Electronics, Jun. 1971, pp. 449-505, vol. 14, Issue 6, Germany. Abstract Only.

Gulleri, G. et al., "Deposition Temperature Determination of HDPCVD Silicon Dioxide Films," 2005, Microelectronic Engineering, vol. 82, pp. 236-241.

International Search Report and Written Opinion of PCT/US2011/054635, mailed Jul. 9, 2012, 11 pages.

International Search Report and Written Opinion of PCT/US2011/054981, mailed May 9, 2012, 10 pages.

International Search Report and Written Opinion of PCT/US2011/054984, mailed May 11, 2012, 10 pages.

(56) References Cited

OTHER PUBLICATIONS

International Search Report and Written Opinion of PCT/US2011/066275, mailed Sep. 24, 2012, 9 pages.
International Search Report and Written Opinion of PCT/US2011/066281, mailed Jul. 19, 2012, 10 pages.
International Search Report and Written Opinion of PCT/US2011/066601, mailed Jul. 20, 2012, 10 pages.
International Search Report and Written Opinion of PCT/US2012/026786, mailed Jan. 2, 2013, 7 pages.
International Search Report and Written Opinion of PCT/US2012/031640 mailed Oct. 18, 2012, 10 pages.
International Search Report and Written Opinion of PCT/US2012/039629, mailed Dec. 26, 2012, 6 pages.
International Search Report and Written Opinion of PCT/US2012/059400, mailed Mar. 26, 2013, 11 pages.
International Search Report and Written Opinion of PCT/US2012/065086, mailed Mar. 25, 2013, 10 pages.
Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, 187 pages.
Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.
Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.
Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.
Norman, et al., "Reaction of Silylphosphine with Ammonia," Inorganic Chemistry, Jun. 1979, pp. 1594-1597, vol. 18 No. 6.
Search Report mailed Sep. 4, 2012, European Application No. 07811964, now patent No. 2022087, 8 pages.
Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.
Tripp, et al., "The Anodic Oxidation of Silicon Nitride Films on Silicon," Journal of the Electrochemical Society, 1970, pp. 157-159, 117(2).
Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY, US, vol. 4, No. 3, Part 01, May 1, 1986, pp. 480-485.
Usenko, et al., "Silicon Nitride Surface Conversion into Oxide to Enable Hydrophilic Bonding," ECS Meeting Abstracts, 2010, 1 page, Abstract #1716, 218th ECS Meeting.
Ward, L. G. L. et al., "The Preparation and Properties of *Bis*-Disilanyl Sulphide and *Tris*-Disilanylamine," J. Inorg. Nucl. Chem., Dec. 1961, pp. 287-293, vol. 21, Pergamon Press Ltd., Northern Ireland.
Ward, Laird G. L., "Bromosilane, Iodosilane, and Trisilylamine," Inorganic Syntheses, 1968, pp. 159-170, vol. 11.
Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.
International Search Report and Written Opinion of PCT/US2012/053999, mailed Feb. 27, 2013, 12 pages.
Wang Li et al., "Properties of Hydrogenated Amorphous Silicon Caarbide Films Irradiated by Excimer Pulse Laser," 1998, Abstract Only.
Ying-Yu et al., "Preparation of SiC Thin Film Using Organosilicon by Remote Plasma CVD Method," 1999, Abstract Only.

\* cited by examiner

LOW COST FLOWABLE DIELECTRIC FILMS

CROSS-REFERENCES TO RELATED APPLICATIONS

This application claims the benefit of U.S. Provisional Application No. 61/699,495 by Chatterjee et al, filed Sep. 11, 2012 and titled "LOW COST FLOWABLE DIELECTRIC FILMS" which is incorporated herein in its entirety for all purposes.

BACKGROUND OF THE INVENTION

Semiconductor device geometries have dramatically decreased in size since their introduction several decades ago. Modern semiconductor fabrication equipment routinely produce devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device have narrowed to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening includes a heat treatment to remove carbon and hydroxyl groups from the deposited material to leave behind a solid dielectric such as silicon oxide. Unfortunately, the departing carbon and hydroxyl species often leave behind pores in the hardened dielectric that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Spin-on dielectrics (SOD) have also been used to flow into features on a patterned substrate. The material is generally converted to silicon oxide from a silazane-type film which contains silicon, nitrogen and hydrogen. Applying dielectric layers as a liquid results in very thick layers and makes it difficult to fill small gaps.

Thus, there is a need for new deposition processes and materials to form dielectric materials on structured substrates using vapor deposition techniques. This and other needs are addressed in the present application.

BRIEF SUMMARY OF THE INVENTION

A method of forming a dielectric layer is described. The method deposits a silicon-containing film by chemical vapor deposition using a local plasma. The silicon-containing film is flowable during deposition at low substrate temperature. A silicon precursor (e.g. a silylamine, higher order silane or halogenated silane) is delivered to the substrate processing region and excited in a local plasma. A second plasma vapor or gas is combined with the silicon precursor in the substrate processing region and may include ammonia, nitrogen ($N_2$), argon, hydrogen ($H_2$) and/or oxygen ($O_2$). The equipment configurations disclosed herein in combination with these vapor/gas combinations have been found to result in flowable deposition at substrate temperatures below or about 200° C. when a local plasma is excited using relatively low power. The process produces transient species which result in a flowable film during deposition before the film solidifies to fill gaps in a patterned substrate.

Embodiments of the invention include methods of forming a dielectric layer on a patterned substrate. The methods include flowing a silicon precursor into the substrate processing region. The methods further include flowing a plasma vapor/gas into a substrate processing region. The methods further include striking a plasma in the substrate processing region by applying a plasma power density less than or about 0.3 W/cm². The methods further include forming the dielectric layer on the patterned substrate. The dielectric layer includes silicon and one of carbon or nitrogen. The dielectric layer is flowable during deposition.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

A method of forming a dielectric layer is described. The method deposits a silicon-containing film by chemical vapor deposition using a local plasma. The silicon-containing film is flowable during deposition at low substrate temperature. A silicon precursor (e.g. a silylamine, higher order silane or halogenated silane) is delivered to the substrate processing region and excited in a local plasma. A second plasma vapor or gas is combined with the silicon precursor in the substrate processing region and may include ammonia, nitrogen ($N_2$), argon, hydrogen ($H_2$) and/or oxygen ($O_2$). The equipment configurations disclosed herein in combination with these vapor/gas combinations have been found to result in flowable deposition at substrate temperatures below or about 200° C. when a local plasma is excited using relatively low power.

The process produces transient species which result in a flowable film during deposition before the film solidifies to fill gaps in a patterned substrate.

Performing plasma chemical vapor deposition or plasma-enhanced chemical vapor deposition (PECVD) involves applying a "local" plasma within a substrate processing region to effect the deposition. Flowing a silicon precursor (e.g. a silylamine such as TSA) along with a plasma vapor/gas disclosed herein was found by the inventors to produce a dielectric layer including silicon, nitrogen, hydrogen. The film has been found to flow during deposition, which facilitates the filling of gaps common on patterned substrates used during semiconductor processing. Additional details about the methods and systems of forming the silicon oxide layer will now be described.

Exemplary Silicon Oxide Formation Process

Figure 1:
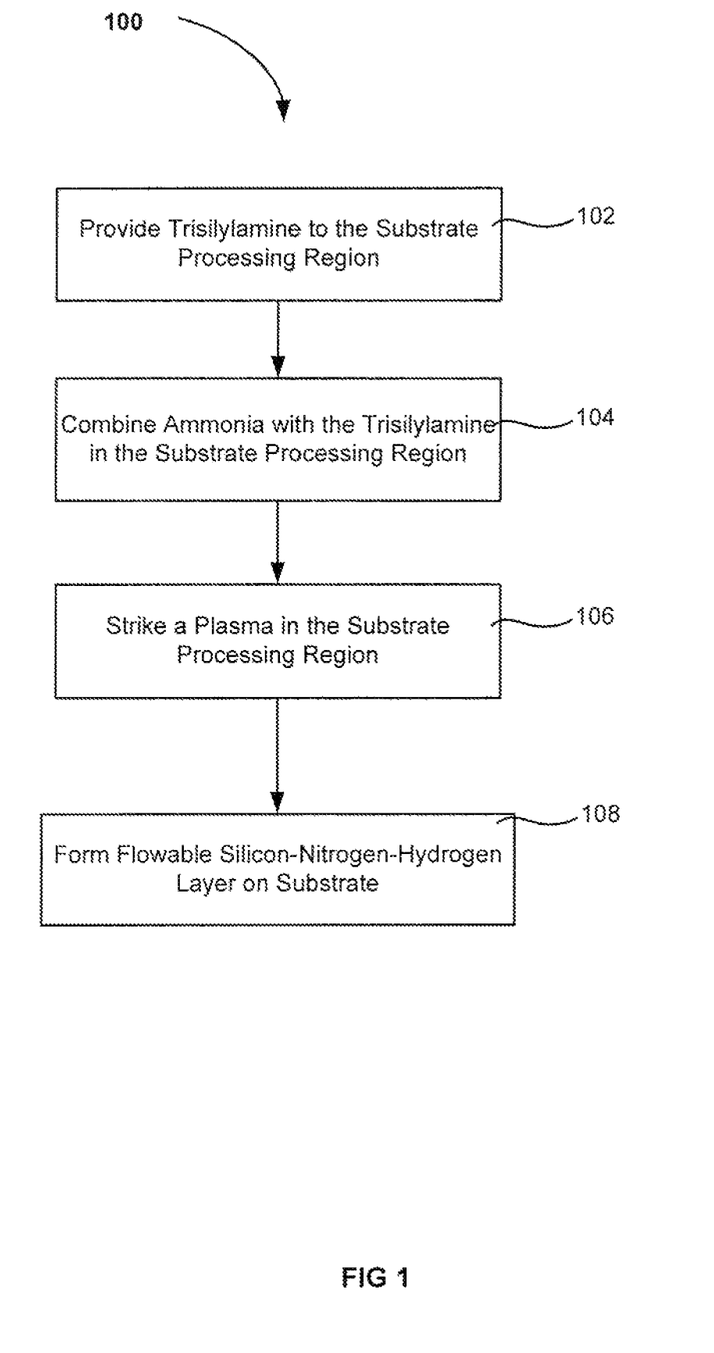
FIG. 1 is a flowchart illustrating selected steps for making a silicon oxide film according to embodiments of the invention.

FIG. 1 is a flowchart showing selected steps in a method 100 of making dielectric films according to embodiments of the invention. The exemplary method 100 includes providing trisilylamine to a substrate processing region 102. The method further includes flowing ammonia into the substrate processing region 104. The trisilylamine and the ammonia may be flowed concurrently into the substrate processing region and may not have been excited by a plasma prior to entry, in embodiments of the invention. Plasma excitation is provided by applying radio-frequency power to capacitive plates on either side of the substrate processing region 106. For example, the capacitive plates may be positioned above and below the substrate processing region. The plasma excitation of the combination of ammonia and the trisilylamine results in formation of a flowable dielectric layer (comprising silicon, nitrogen, hydrogen) on a patterned substrate surface.

Generally speaking, the trisilylamine may be referred to herein as a silicon precursor which contains a silylamine, but the silicon precursor may also contain carbon. The silicon precursor may contain one of trisilylamine, disilylamine or monosilylamine. The silicon precursor is delivered in the form in the gas phase in the form of a gas or vapor carried by a carrier gas. As will be discussed in detail shortly, an absence of carbon reduces the shrinkage of the deposited film. However, the silicon precursor and the dielectric film contain carbon in disclosed embodiments. Silicon carbide and silicon carbon nitride are desirable in some process flows and lie within the definition of flowable dielectric layers deposited using methods disclosed herein. That being said, the silicon precursor may be oxygen-free and carbon-free in disclosed embodiments. The lack of oxygen results in a lower or negligible concentration of silanol (Si—OH) groups in the flowable dielectric layer formed from the precursors. Excess silanol moieties in the deposited film can cause increased porosity and shrinkage during post deposition steps that remove the hydroxyl (—OH) moieties from the deposited layer.

Specific examples of silicon precursors may include silylamines such as $H_2N(SiH_3)$, $HN(SiH_3)_2$, and $N(SiH_3)_3$. The silicon precursor may also be a higher order silane, herein defined as $Si_nH_{2n+2}$, where n>=3. Silicon precursors may also be halogenated silanes and may be chlorinated silanes in embodiments of the invention. Halogenated silanes are defined herein as $Si_nH_{2n+2}$, where n>=1 or n>=2 in disclosed embodiments, where at least one of the hydrogen atoms is removed and replaced with a halogen. The silicon precursor is, for example, hexachlorodisilane $Si_2Cl_6$) in disclosed embodiments. The flow rates of a silicon precursor may be greater than or about 40 sccm, greater than or about 60 sccm or greater than or about 100 sccm in different embodiments. All flow rates given herein refer to a dual chamber substrate processing system. Single wafer systems would require half these flow rates and other wafer sizes would require flow rates scaled by the processed area. The silicon precursor may be mixed with additional gases that may act as carrier gases, reactive gases, or both.

A plasma vapor/gas is combined with the silicon precursor and flowed into the substrate processing region or flowed separately into the substrate processing region where the combination of the silicon precursor and the plasma vapor/gas are excited in a plasma. Exemplary plasma vapor/gases include ammonia, $H_2$, $N_2$, $O_2$, $H_2O$, $O_3$, $H_2O_2$, $N_2O$, NO, He, and Ar, among other gases. The plasma vapor/gas may contain carbon in order to form silicon carbide and SiCN films, in which case the plasma vapor/gas may include methane, ethane, propane, butane, acetylene, or other hydrocarbon. The flow rate of the plasma vapor/gas may be greater than or about 25 sccm, greater than or about 40 sccm or greater than or about 50 sccm in disclosed embodiments. Sources of oxygen may not be included, in embodiments, to increase flowability.

As described in the example, the plasma may be ignited using a capacitively coupled plasma (CCP) configuration using radio frequencies near 13.56 MHz. However, other frequencies and excitation sources may be used such as higher and/or lower radio frequencies (e.g. 2.4 GHz in the microwave region or 350 kHz). An inductively coupled plasma (ICP) may be used in combination or in place of the CCP. The plasma power is relatively low to cause the formation of flow-inducing chemical transients in the forming film. For a 300 mm substrate, the power may be in the 10-350 W range. The power density may be less than or about 0.3 W per square centimeter, less than or about 0.25 W per square centimeter, less than or about 0.2 W per square centimeter or less than or about 0.15 W per square centimeter of patterned substrate area in embodiments of the invention. The power may be on continuously rather than pulsed in disclosed embodiments while during formation of the dielectric layer. In disclosed embodiments, striking the plasma means applying 0.025 W to 0.30 W (per square centimeter of patterned surface area) of plasma power to the substrate processing region. Patterned surface area is calculated as the area on a single plane passing through the patterned features (generally on the top surface of a substrate). The plasma excitation may also be effected by shining ultraviolet (UV) light into the substrate processing region.

Flowing the silicon precursor comprises supplying a continuous flow of the silicon precursor to the substrate processing region throughout formation of the flowable dielectric layer. Similarly, striking the plasma comprises applying a plasma power continuously throughout formation of the flowable dielectric layer. It has been found that pulsing either (and, of course, both) the silicon precursor flow or the plasma power results in a conformal film instead of the desirably flowable dielectric films described herein. The flow of plasma vapor/gas is also continuous throughout formation of the flowable dielectric layer, in embodiments of the invention.

In the substrate processing region, the silicon precursor and the plasma vapor/gas mix and react in the plasma to deposit the flowable dielectric film on the deposition substrate. The flowable dielectric film contains silicon, nitrogen, and hydrogen and may consist only of these elements in embodiments of the invention. The deposited dielectric film has flowable characteristics unlike conventional silicon nitride ($Si_3N_4$) film deposition techniques. The flowable nature during formation allows the film to flow into narrow features before solidifying. Nitrogen in the silicon-nitrogen-and-hydrogen-containing film may originate from both the plasma vapor/gas and the silicon precursor since both the silicon precursor and the nitrogen trifluoride can contain nitrogen.

The flowability of a silicon-containing film may be due to a variety of properties which result from mixing plasma vapor/gases with silicon precursor outlined herein in the presence of a low intensity local plasma as described above. These properties may include a presence of short chained polysilazane polymers which may have hydrogen and/or halogen termination. These short chains grow and network to form more dense dielectric material during and after the formation of the film. For example the deposited film may have a silazane-type, Si—NH—Si backbone (i.e., a carbon-free Si—N—H film).

In some embodiments, all precursors supplied to the plasma in the substrate processing region are carbon-free and therefore the deposited silicon-nitrogen-fluorine-and-hydrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing precursor. The amount of these carbon impurities however are much less than would be found in a silicon precursor having a carbon moiety (e.g., TEOS, TMDSO, etc.).

The silicon precursor and plasma vapor/gas may also be selected to form silicon carbide or silicon carbon nitride (SiCN) rather than the aforementioned silicon nitride. In all cases, the silicon nitride, silicon carbide or SiCN may contain some hydrogen which may assist in the flowability of the film. The flowable dielectric film consists of silicon, carbon and hydrogen in disclosed embodiments. The flowable dielectric film may also consist of silicon and carbon. The flowable dielectric film consists of silicon, nitrogen and hydrogen in disclosed embodiments. The flowable dielectric film may also consist of silicon and nitrogen. The flowable dielectric film consists of silicon, carbon, nitrogen and hydrogen in disclosed embodiments. The flowable dielectric film may also consist of silicon, carbon and nitrogen.

The temperature of the substrate during deposition of the flowable dielectric layer may be less than or about 200° C., less than or about 150° C., less than or about 125° C., less than or about 100° C., less than or about 75° C., less than or about 50° C., or less than or about 30° C. in disclosed embodiments. For example, the substrate temperature may be less than 150° C. while growing a silicon-nitrogen-hydride film from a silylamine and a plasma vapor/gas. For another example, the substrate temperature may be less than 80° C. while growing a silicon-nitrogen-hydride film from a higher order silane and a plasma vapor/gas. Also in a disclosed embodiment, the substrate temperature may be less than 150° C. while growing a silicon-nitrogen-hydride film from a halogenated silane of any order and a plasma vapor/gas.

The pressure in the substrate processing region during the deposition may be greater than or about 5 Torr, greater than or about 10 Torr, greater than or about 15 Torr or greater than or about 20 Torr in disclosed embodiments. The pressure in the substrate processing region during the deposition may be less than or about 50 Torr, less than or about 40 Torr or less than or about 30 Torr in disclosed embodiments. Upper limits may be combined with lower limits to arrive at additional pressure ranges according to embodiments of the invention. The deposition rate of the flowable dielectric film may be greater than or about 400 Å/min, greater than or about 500 Å/min, greater than or about 600 Å/min or greater than or about 700 Å/min in disclosed embodiments. The thickness of the deposited dielectric layer after solidification may be much less than is possible using bulk spin-on techniques (SOG, SOD). The thickness may be less than or about 25 nm, less than or about 20 nm, less than or about 15 nm or less than or about 10 nm in disclosed embodiments. These thicknesses are measured perpendicular to the major plane of the patterned substrate and after the flowable characteristics of the deposited film have abated.

Optional steps are now described and help to cure the film (to remove some components which made the nascent film flowable but are no longer needed). Following the deposition of the flowable dielectric film, the deposition substrate may treated at an elevated temperature to remove volatile species. The deposition substrate may remain in the substrate processing region for curing, or the substrate may be transferred to a different chamber where the heat treatment is performed. The curing temperature of the substrate may be less than or about 600° C., less than or about 400° C., less than or about 300° C., less than or about 250° C., less than or about 200° C. or less than or about 150° C. in disclosed embodiments. The temperature of the substrate may be greater than or about room temperature (25° C.), greater than or about 50° C., greater than or about 100° C., greater than or about 150° C. or greater than or about 200° C. in embodiments of the invention. Any of the upper bounds may be combined with any of the lower bounds to form additional ranges for the substrate temperature according to additional disclosed embodiments.

As already discussed, the curing operation may occur in the deposition chamber or the substrate may be transferred to an ex-situ curing chamber. In either case, the deposition operation and the curing operation may be repeated to form dep-cure-dep-cure process sequences. A plasma treatment may be present in the substrate processing region during the curing operation and the plasma may be an inductively coupled plasma (ICP) or a capacitively coupled plasma (CCP). The plasma may be a high-density plasma (HDP) in disclosed embodiments. The plasma treatment may be effected by applying power at a frequency in the radio-frequency (RF) range (e.g. 13.56 MHz) or in the microwave frequency range (e.g. 2.4 GHz). The plasma may be formed from various plasma input gases such as $NH_3$, Ar, $N_2$, $Cl_2$, or He in embodiments of the invention.

The patterned substrate may have a plurality of gaps for the spacing and structure of device components (e.g., transistors) formed on the substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., less than 90 nm, 65 nm, 50 nm, 45 nm, 32 nm, 22 nm, 16 nm, etc.). The flowable dielectric layer is desirable since it can fill the exemplary narrow gaps more easily than non-flowable films or bulk flowable films using spin-on techniques, such as spin-on glass (SOG) and spin-on dielectric (SOD). Depositing thin layers of flowable material reduces the likelihood of prematurely clogging the top of a gap before it is completely filled to leave a void in the middle of the gap. The dielectric layer may be solidified after the flowable deposition. Additional parameters parameters may be introduced during the description of an exemplary silicon oxide deposition system.

Exemplary Silicon Oxide Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 2:
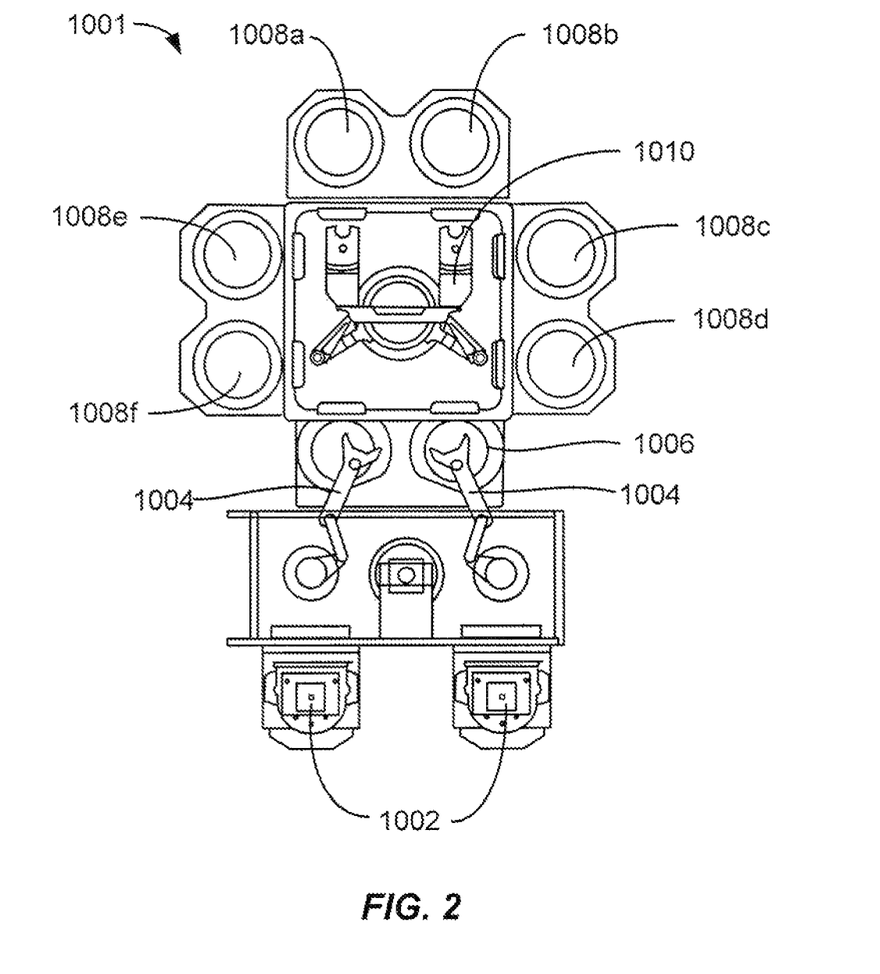
FIG. 2 shows a substrate processing system according to embodiments of the invention.

Embodiments of the deposition systems may be incorporated into larger fabrication systems for producing integrated circuit chips. FIG. 2 shows one such system 1001 of deposition, baking and curing chambers according to disclosed embodiments. In the figure, a pair of FOUPs (front opening unified pods) 1002 supply substrate substrates (e.g., 300 mm diameter wafers) that are received by robotic arms 1004 and placed into a low pressure holding area 1006 before being placed into one of the wafer processing chambers 1008a-f. A second robotic arm 210 may be used to transport the substrate wafers from the holding area 1006 to the processing chambers 1008a-f and back.

The processing chambers 1008a-f may include one or more system components for depositing, annealing, curing and/or etching a flowable dielectric film on the substrate wafer. In one configuration, two pairs of the processing chamber (e.g., 1008c-d and 1008e-f) may be used to deposit the flowable dielectric material on the substrate, and the third pair of processing chambers (e.g., 1008a-b) may be used to anneal the deposited dielectric. In another configuration, the same two pairs of processing chambers (e.g., 1008c-d and 1008e-f) may be configured to both deposit and anneal a flowable dielectric film on the substrate, while the third pair of chambers (e.g., 1008a-b) may be used for UV or E-beam curing of the deposited film. In still another configuration, all three pairs of chambers (e.g., 1008a-f) may be configured to deposit and cure a flowable dielectric film on the substrate. In yet another configuration, two pairs of processing chambers (e.g., 1008c-d and 1008e-f) may be used for both deposition and UV or E-beam curing of the flowable dielectric, while a third pair of processing chambers (e.g. 1008a-b) may be used for annealing the dielectric film. Any one or more of the processes described may be carried out on chamber(s) separated from the fabrication system shown in different embodiments.

In addition, one or more of the process chambers 1008a-f may be configured as a wet treatment chamber. These process chambers include heating the flowable dielectric film in an atmosphere that includes moisture. Thus, embodiments of system 1001 may include wet treatment chambers 1008a-b and anneal processing chambers 1008c-d to perform both wet and dry anneals on the deposited dielectric film.

Figure 3A:
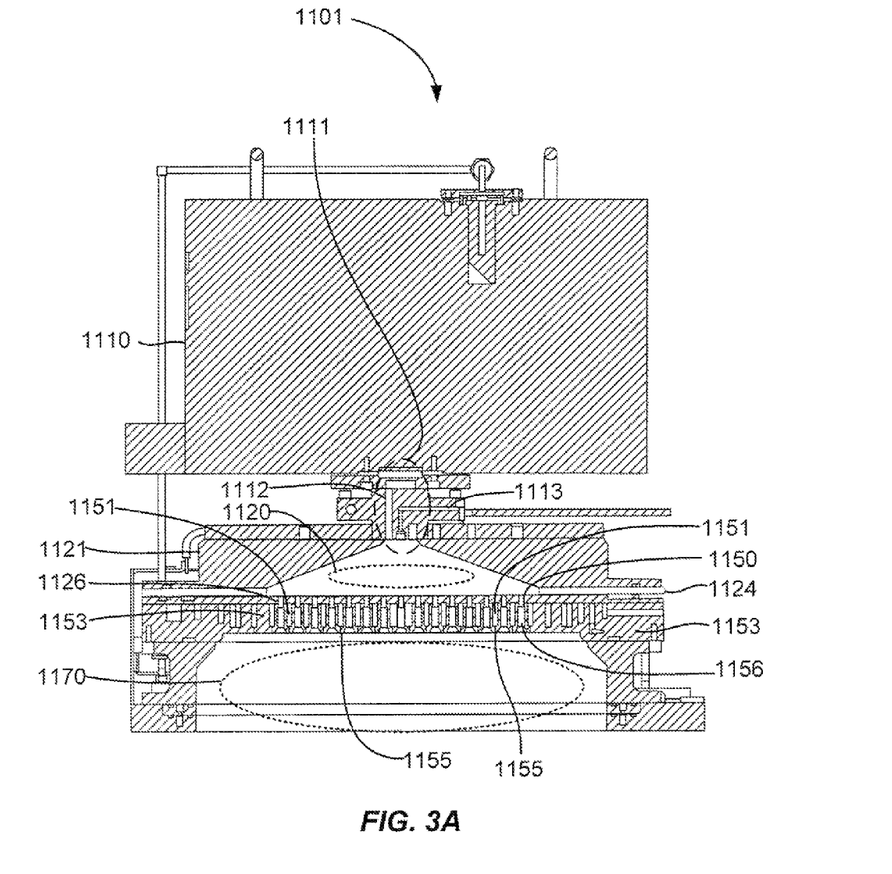
FIG. 3A shows a substrate processing chamber according to embodiments of the invention.

FIG. 3A is a substrate processing chamber 1101 according to disclosed embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in disclosed embodiments. The lid (or conductive top portion) 1121 and a perforated partition (showerhead 1153) are shown with an insulating ring 1124 in between, which allows an AC potential to be applied to the lid 1121 relative to showerhead 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through-holes 1156 that traverse the thickness of the plate. The showerhead 1153 also has one or more hollow volumes 1151 which can be filled with a precursor in the form of a vapor or gas (such as a silicon-containing precursor) and pass through small holes 1155 into substrate processing region 1170 but not directly into chamber plasma region 1120. Showerhead 1153 is thicker than the length of the smallest diameter 1150 of the through-holes 1156 in this disclosed embodiment. In order to maintain a significant concentration of excited species penetrating from chamber plasma region 1120 to substrate processing region 1170, the length 1126 of the smallest diameter 1150 of the through-holes may be restricted by forming larger diameter portions of through-holes 1156 part way through the showerhead 1153. The length of the smallest diameter 1150 of the through-holes 1156 may be the same order of magnitude as the smallest diameter of the through-holes 1156 or less in disclosed embodiments.

In the embodiment shown, showerhead 1153 may distribute (via through-holes 1156) process gases which contain a plasma vapor/gas such as ammonia and the silicon precursor. The precursors may not be excited in chamber plasma region 1120, in embodiments, since only a local plasma is necessary. Note that any of the precursors may be supplied either via through-holes 1156 or via small holes 1155 into substrate processing region 1170 since this process involves excitation by a local plasma within substrate processing region 1170. The process gases enter substrate processing region 1170 where they are excited in a local plasma to form the flowable dielectric layer on the patterned substrate.

In embodiments, the number of through-holes 1156 may be between about 60 and about 2000. Through-holes 1156 may have a variety of shapes but are most easily made round. The smallest diameter 1150 of through-holes 1156 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 1155 used to introduce a gas into substrate processing region 1170 may be between about 100 and about 5000 or between about 500 and about 2000 in different embodiments. The diameter of the small holes 1155 may be between about 0.1 mm and about 2 mm.

Figure 3B:
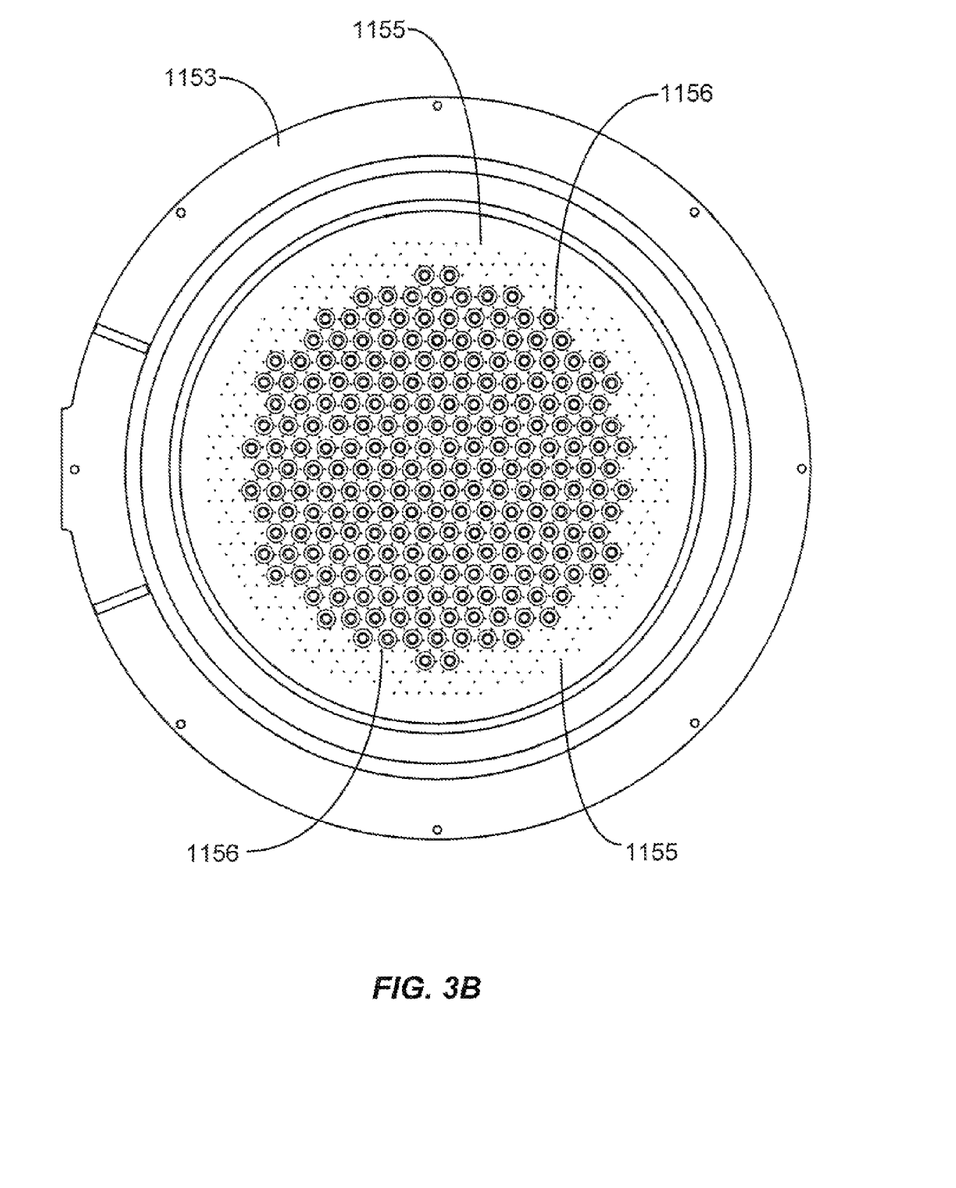
FIG. 3B shows a gas distribution showerhead according to embodiments of the invention.

FIG. 3B is a bottom view of a showerhead 1153 for use with a processing chamber according to disclosed embodiments. Showerhead 1153 corresponds with the showerhead shown in FIG. 3A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing than other embodiments described herein.

An exemplary film is created on a substrate supported by a pedestal (not shown) within substrate processing region 1170 when plasma effluents arriving through through-holes 1156 in showerhead 1153 combine with a silicon-containing precursor arriving through the small holes 1155 originating from hollow volumes 1151. Though substrate processing region 1170 may be equipped to support a plasma for other processes such as curing, no plasma is present during the growth of the exemplary film.

A plasma may be ignited either in chamber plasma region 1120 above showerhead 1153 or substrate processing region 1170 below showerhead 1153. A plasma is present in chamber plasma region 1120 to produce the radical nitrogen precursor from an inflow of a nitrogen-and-hydrogen-containing gas. An AC voltage typically in the radio frequency (RF) range is applied between the conductive top portion (lid 1121) of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 1170 is turned on during the formation of the dielectric layer or while cleaning the interior surfaces bordering substrate processing region 1170. A plasma in substrate processing region 1170 is ignited by applying an AC voltage between showerhead 1153 and the pedestal or bottom of the chamber. A cleaning gas may be introduced into substrate processing region 1170 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the deposition system. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate, converting a film to silicon oxide or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. In some embodiments, silicon oxide consists essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-nitrogen precursor" is a radical precursor which contains nitrogen and a "radical-hydrogen precursor" is a radical precursor which contains hydrogen. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a dielectric layer on a patterned substrate, the method comprising:
   Transferring the patterned substrate into a substrate processing region;
   flowing a silicon precursor into the substrate processing region;
   flowing a plasma vapor/gas into the substrate processing region, wherein flowing the plasma vapor/gas and flowing the silicon precursor occur concurrently;
   striking a plasma in the substrate processing region by applying a plasma power less than or about 0.3 W per square centimeter of patterned substrate area; and
   forming the dielectric layer on the patterned substrate, wherein the dielectric layer comprises silicon and one of nitrogen or carbon and the dielectric layer is flowable during deposition,
   wherein flowing the silicon precursor comprises supplying a continuous flow of the silicon precursor to the substrate processing region throughout formation of the flowable dielectric layer, and wherein striking a plasma comprises applying a plasma power continuously throughout formation of the flowable dielectric layer.

2. The method of claim 1 wherein a temperature of the patterned substrate is less than 200° C. while forming the flowable dielectric layer.

3. The method of claim 1 wherein the plasma vapor/gas comprises one of ammonia, hydrogen ($H_2$), argon, nitrogen ($N_2$), a hydrocarbon or oxygen ($O_2$).

4. The method of claim 1 wherein the silicon precursor is one of trisilylamine, disilylamine or monosilylamine.

5. The method of claim 1 wherein the silicon precursor comprises a higher order silane containing three or more silicon atoms.

6. The method of claim 1 wherein the silicon precursor comprises a halogen-substituted silane.

7. The method of claim 6 wherein the halogen-substituted silane is hexachlorodisilane.

8. The method of claim 1 wherein the dielectric layer is one of silicon carbide, silicon nitride or SiCN.

9. The method of claim 1 wherein the dielectric layer consists of silicon, nitrogen, and hydrogen.

10. The method of claim 1 wherein the dielectric layer consists of silicon, carbon, nitrogen, and hydrogen.

11. The method of claim 1 wherein striking the plasma comprises applying radio frequencies (RF) to the substrate processing region by either capacitive or inductive means.

12. The method of claim 1 wherein striking the plasma comprises shining ultraviolet (UV) light into the substrate processing region.

13. The method of claim 1 wherein striking the plasma comprises applying 0.025 W to 0.30 W (per square centimeter of patterned surface area) of plasma power to the substrate processing region.

14. The method of claim 1 wherein striking the plasma comprises applying plasma power continuously throughout while forming the dielectric layer.

15. The method of claim 1 wherein the substrate is patterned and has a trench having a width of about 50 nm or less.

16. The method of claim 1 further comprising solidifying the dielectric layer after the operation of forming the dielectric layer.

17. The method of claim 16 wherein a thickness of the dielectric layer after solidification is about 25 nm or less perpendicular to the major plane of the patterned substrate.

18. The method of claim 1 wherein the silicon precursor, the plasma vapor/gas and the dielectric layer are each carbon-free.

19. The method of claim 1 wherein a temperature of the patterned substrate is less than 100° C. while forming the flowable dielectric layer.

20. The method of claim 1 wherein a temperature of the patterned substrate is less than 30° C. while forming the flowable dielectric layer.

* * * * *